(12) United States Patent
Qian et al.

(10) Patent No.: US 11,805,667 B2
(45) Date of Patent: Oct. 31, 2023

(54) ENCAPSULATION STRUCTURE, ELECTRONIC APPARATUS AND ENCAPSULATION METHOD

(71) Applicant: BOE TECHNOLOGY GROUP CO., LTD., Beijing (CN)

(72) Inventors: Lingzhi Qian, Beijing (CN); Rui Hong, Beijing (CN); Song Zhang, Beijing (CN); Penghao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 27 days.

(21) Appl. No.: 16/652,712

(22) PCT Filed: Sep. 23, 2019

(86) PCT No.: PCT/CN2019/107269
§ 371 (c)(1),
(2) Date: Apr. 1, 2020

(87) PCT Pub. No.: WO2020/063530
PCT Pub. Date: Apr. 2, 2020

(65) Prior Publication Data
US 2021/0226162 A1    Jul. 22, 2021

(30) Foreign Application Priority Data
Sep. 28, 2018   (CN) .......................... 201811142808.8

(51) Int. Cl.
*H10K 50/844*    (2023.01)
*H01L 33/56*    (2010.01)
*H10K 71/00*    (2023.01)

(52) U.S. Cl.
CPC .......... *H10K 50/844* (2023.02); *H01L 33/56* (2013.01); *H10K 71/00* (2023.02); *H01L 2933/005* (2013.01)

(58) Field of Classification Search
CPC ................. H01L 51/5253; H01L 33/56; H01L 2933/005; H01L 2251/5338; H01L 33/52; H01L 51/5246; Y02E 10/549
See application file for complete search history.

(56) References Cited

U.S. PATENT DOCUMENTS 9,048,404 B2 * 6/2015 Sun ......................... H01L 33/60
10,134,646 B2  11/2018 Byun et al.
(Continued)

FOREIGN PATENT DOCUMENTS

CN          1669363       9/2005
CN        106784386       5/2017
(Continued)

OTHER PUBLICATIONS

Translation of KR 10-2008-0101690 A (Hayasho Kenji) filing date May 8, 2008. (Year: 2008).*
(Continued)

*Primary Examiner* — Jay C Chang
(74) *Attorney, Agent, or Firm* — Leason Ellis LLP

(57) ABSTRACT

An encapsulation structure, an electronic apparatus, and an encapsulation method are provided. The encapsulation structure includes: a base substrate, an organic encapsulation layer and a barrier dam that are on the base substrate. The barrier dam is disposed outside the organic encapsulation layer; and the barrier dam includes an upper surface away from the base substrate and a side surface facing the organic encapsulation layer, and at least one of the upper surface and the side surface includes a groove and a protrusion.

20 Claims, 11 Drawing Sheets

(56) References Cited

U.S. PATENT DOCUMENTS

| | | | |
|---|---|---|---|
| 10,748,973 B2 | 8/2020 | Han et al. | |
| 2005/0189878 A1* | 9/2005 | Shitagami | H01L 51/5246 313/512 |
| 2008/0297041 A1 | 12/2008 | Park | |
| 2010/0089636 A1* | 4/2010 | Ramadas | B82Y 15/00 174/521 |
| 2010/0264817 A1* | 10/2010 | Bouten | G02F 1/133305 313/512 |
| 2014/0160710 A1* | 6/2014 | Yan | H05K 3/30 361/748 |
| 2014/0306195 A1* | 10/2014 | Oh | H01L 51/5246 257/40 |
| 2015/0207099 A1* | 7/2015 | Kao | H01L 27/3223 257/40 |
| 2016/0043346 A1* | 2/2016 | Kamiya | H01L 51/5246 257/40 |
| 2016/0343954 A1* | 11/2016 | Seo | C09K 11/06 |
| 2016/0351760 A1* | 12/2016 | Hayashi | H01L 33/505 |
| 2017/0047307 A1* | 2/2017 | Uzoh | H01L 25/0657 |
| 2017/0069873 A1 | 3/2017 | Kim et al. | |
| 2018/0090517 A1* | 3/2018 | Park | H01L 51/5246 |
| 2018/0151833 A1* | 5/2018 | Riegel | H01L 51/5253 |
| 2018/0375060 A1* | 12/2018 | Li | H01L 51/5259 |
| 2019/0140209 A1* | 5/2019 | Hamer | B23K 1/0008 |
| 2019/0363275 A1* | 11/2019 | Ochi | H01L 51/5246 |
| 2020/0075700 A1* | 3/2020 | Cao | H01L 51/56 |

FOREIGN PATENT DOCUMENTS

| | | |
|---|---|---|
| CN | 107204404 | 9/2017 |
| CN | 107359273 | 11/2017 |
| CN | 107808930 | 3/2018 |
| CN | 108110030 | 6/2018 |
| CN | 109301084 | 2/2019 |
| KR | 1020080087257 | 10/2008 |
| WO | 2011004567 | 1/2011 |

OTHER PUBLICATIONS

KR 10-2008-0101690. (Year: 2008).*
Chinese Office Action dated Dec. 30, 2019 corresponding to Chinese Patent Application No. 201811142808.8; 15 pages.

* cited by examiner

ENCAPSULATION STRUCTURE, ELECTRONIC APPARATUS AND ENCAPSULATION METHOD

The present application is a U.S. National Phase Application under 35 U.S.C. § 371 of International Patent Application No. PCT/CN2019/107269, filed Sep. 23, 2019, and claims priority to Chinese Patent Application No. 201811142808.8 filed on Sep. 28, 2018, the present disclosure of which are incorporated herein by reference in their entirety as part of the present disclosure.

TECHNICAL FIELD

At least one embodiment of the present disclosure relates to an encapsulation structure, an electronic apparatus, and an encapsulation method.

BACKGROUND

Some electronic devices (such as OLED devices) have poor ability to resist water vapor and oxygen. If the electronic devices are exposed to water vapor or oxygen, the lifetimes of the electronic devices are reduced. For the encapsulation of the electronic devices, a current advanced encapsulation technology is the film encapsulation technology. For example, a plurality of inorganic encapsulation layers overlap with each other to form an encapsulation film, or an inorganic encapsulation layer and an organic encapsulation layer overlap with each other to form an encapsulation film. With the development of display industry, ultra-narrow frame displays are more and more popular. It is of great significance to achieve a narrower frame while achieving a better sealing effect.

SUMMARY

At least one embodiment of the present disclosure provides an encapsulation structure, which comprises: a base substrate, an electronic device, an organic encapsulation layer and a barrier dam. The electronic device, the organic encapsulation layer, and the barrier dam are on the base substrate. The organic encapsulation layer covers the electronic device; the barrier dam is disposed outside the organic encapsulation layer; and the barrier dam comprises an upper surface away from the base substrate and a side surface facing the organic encapsulation layer, and at least one selected from a group consisting of the upper surface and the side surface comprises a groove and a protrusion.

For example, in the encapsulation structure provided by at least one embodiment of the present disclosure, the groove and the protrusion are configured that at least one selected from the group consisting of the upper surface and the side surface has a surface roughness Rz which is larger than 5 nm.

For example, the encapsulation structure provided by at least one embodiment of the present disclosure further comprises a first inorganic layer stacked with the organic encapsulation layer; both of the organic encapsulation layer and the barrier dam are on a side of the first inorganic layer away from the base substrate.

For example, in the encapsulation structure provided by at least one embodiment of the present disclosure, an edge of the organic encapsulation layer is in contact with the side surface of the barrier dam; or the edge of the organic encapsulation layer is in contact with the upper surface of the barrier dam.

For example, in the encapsulation structure provided by at least one embodiment of the present disclosure, the edge of the organic encapsulation layer comprises an inclined surface, and the inclined surface has an included angle with a surface of the base substrate facing the organic encapsulation layer; the inclined surface comprises a first end and a second end, and from the first end to the second end, a thickness of the organic encapsulation layer in a direction perpendicular to the base substrate is gradually reduced; and a width of an orthographic projection of the inclined surface on the base substrate in a direction from an orthographic projection of the first end on the base substrate to an orthographic projection of the second end on the base substrate is less than 2 mm.

For example, the encapsulation structure provided by at least one embodiment of the present disclosure further comprises a second inorganic layer stacked with the organic encapsulation layer; the second inorganic layer covers the organic encapsulation layer and the barrier dam, and the second inorganic layer is in contact with the side surface of the barrier dam or in contact with both of the upper surface of the barrier dam and the side surface of the barrier dam.

For example, in the encapsulation structure provided by at least one embodiment of the present disclosure, a gap is between the organic encapsulation layer and the barrier dam, so that the organic encapsulation layer and the barrier dam do not contact with each other.

For example, the encapsulation structure provided by at least one embodiment of the present disclosure further comprises a second inorganic layer stacked with the organic encapsulation layer, the second inorganic layer covers the organic encapsulation layer, the barrier dam, and the gap, the second inorganic layer is in contact with both of the upper surface of the barrier dam and the side surface of the barrier dam, and the second inorganic layer is in contact with the first inorganic layer at the gap.

For example, the encapsulation structure provided by at least one embodiment of the present disclosure further comprises a first inorganic layer stacked with the organic encapsulation layer; the organic encapsulation layer is on a side of the first inorganic layer away from the base substrate; the first inorganic layer covers the barrier dam, and the first inorganic layer is in contact with the upper surface of the barrier dam and the side surface of the barrier dam; and a portion, covering the barrier dam, of a surface of the first inorganic layer away from the base substrate comprises a groove and a protrusion.

For example, the encapsulation structure provided by at least one embodiment of the present disclosure further comprises a second inorganic layer stacked with the organic encapsulation layer; the second inorganic layer covers the organic encapsulation layer and the first inorganic layer, and the second inorganic layer is in contact with the surface of the first inorganic layer away from the base substrate.

For example, in the encapsulation structure provided by at least one embodiment of the present disclosure, a height of the barrier dam in a direction perpendicular to the base substrate is smaller than a thickness of the organic encapsulation layer in the direction perpendicular to the base substrate.

For example, in the encapsulation structure provided by at least one embodiment of the present disclosure, viewed from a direction perpendicular to the base substrate, a planar shape of the barrier dam is a closed ring shape or an unclosed ring shape.

For example, in the encapsulation structure provided by at least one embodiment of the present disclosure, viewed from the direction perpendicular to the base substrate, a planar shape of the barrier dam comprises a plurality of strips extending along an edge of the organic encapsulation layer.

For example, in the encapsulation structure provided by at least one embodiment of the present disclosure, where viewed from a direction perpendicular to the base substrate, a planar shape of the organic encapsulation layer comprises a corner, and a planar shape of the barrier dam comprises a bent portion surrounding the corner of the organic encapsulation layer.

For example, the encapsulation structure provided by at least one embodiment of the present disclosure comprises a plurality of the barrier dams, and in a direction away from the organic encapsulation layer, the plurality of barrier dams are spaced apart from each other.

For example, in the encapsulation structure provided by at least one embodiment of the present disclosure, a material of the barrier dam is a hydrophobic material.

For example, in the encapsulation structure provided by at least one embodiment of the present disclosure, the hydrophobic material is polyurethane or polydimethylsiloxane.

For example, in the encapsulation structure provided by at least one embodiment of the present disclosure, the electronic device is an organic light-emitting diode device or an inorganic light-emitting diode device.

At least one embodiment of the present disclosure further provides an electronic apparatus which comprises the encapsulation structure according to any one of the embodiments of the present disclosure.

At least one embodiment of the present disclosure further provides an encapsulation method, which comprises: providing a base substrate; forming an electronic device on the base substrate; forming an organic encapsulation layer, in which the organic encapsulation layer covers the electronic device; forming a barrier dam, in which the barrier dam comprises an upper surface away from the base substrate and a side surface facing the organic encapsulation layer, and at least one selected from a group consisting of the upper surface and the side surface comprises a groove and a protrusion, in which the organic encapsulation layer is formed after forming the barrier dam, and the barrier dam is formed outside the organic encapsulation layer.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The drawings used in the present disclosure are not drawn in strict accordance with the actual scale, and the specific size and quantity of each structure can be determined according to actual needs. The drawings described in the present disclosure are only structural diagrams.

Figure 1:
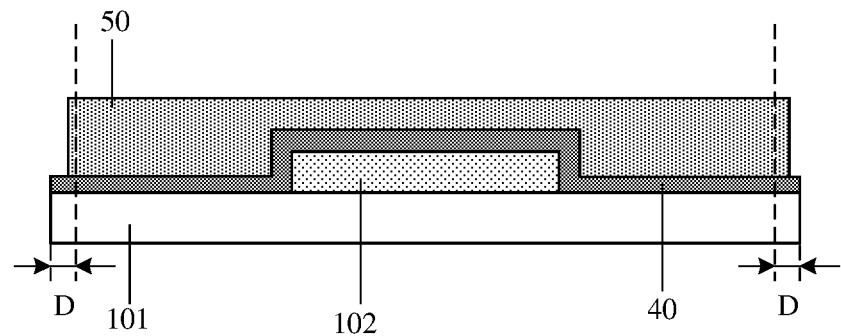
FIG. 1 is a schematic diagram of an encapsulation structure.

FIG. 1 is a schematic diagram of an electronic device. As illustrated in FIG. 1, the electronic apparatus comprises a base substrate 101, a light-emitting device 102, an inorganic encapsulation layer 40 and an organic encapsulation layer 50. The light-emitting device 102, the inorganic encapsulation layer 40 and the organic encapsulation layer 50 are disposed on the base substrate 101. The organic encapsulation layer 50 is disposed on the inorganic encapsulation layer 40. In the electronic apparatus, the base substrate 1 has an edge and a non-functional region D close to the edge, for example, the electronic device is a display panel, and the non-functional region D is a non-display region. For example, devices such as driving circuits are disposed in the non-functional region D. For example, a liquid organic material is used to form the organic encapsulation layer 50; in the process of forming the organic encapsulation layer 50, the liquid organic material may spread to the non-functional region D, so that the liquid organic material is easy to go beyond a preset region for disposing the organic encapsulation layer 50 and then enter the non-functional region D of the base substrate 101, affecting the disposing of the devices such as driving circuits in the non-functional region D, thus it is necessary to reserve a larger area for the non-functional region D, which is not beneficial to realizing a narrow frame structure. In addition, in the electronic device, the inorganic encapsulation layer 40 has poor ductility and is easy to generate cracks. Moreover, the bonding strength of the inorganic encapsulation layer 40 and the organic encapsulation layer 50 is low, and the inorganic encapsulation layer 40 and the organic encapsulation layer 50 are easy to be separated from each other, which is not beneficial to the stress release of the inorganic encapsulation layer 40 when the inorganic encapsulation layer 40 is bent, so the inorganic encapsulation layer 40 is easy to generate cracks. Therefore, external humidity, oxygen and so on contact the light-emitting device 102 through the cracks, which reduces the service life of the light-emitting device 102.

At least one embodiment of the present disclosure provides an encapsulation structure, the encapsulation structure comprises: a base substrate, an electronic device, an organic encapsulation layer and a barrier dam. The electronic device, the organic encapsulation layer and the barrier dam are on the base substrate. The organic encapsulation layer covers the electronic device; the barrier dam is disposed outside the organic encapsulation layer; and the barrier dam comprises an upper surface away from the base substrate and a side surface facing the organic encapsulation layer, and at least one selected from a group consisting of the upper surface and the side surface comprises a groove and a protrusion.

Figure 2A:
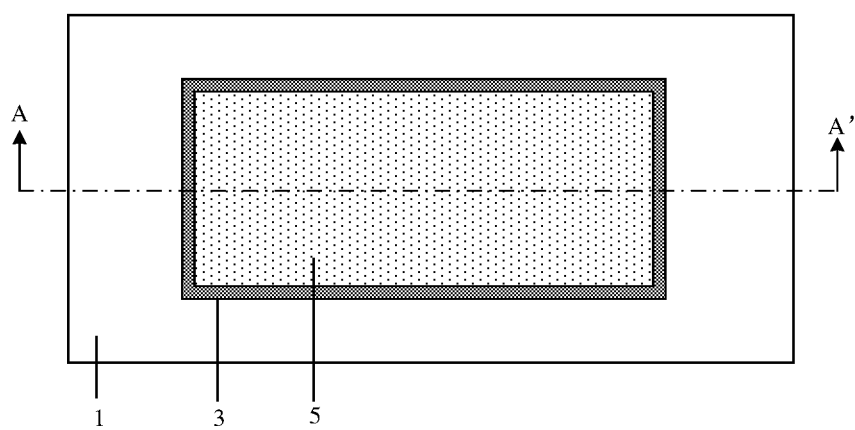
FIG. 2A is a schematic planar diagram of an encapsulation structure provided by an embodiment of the present disclosure.
Figure 2B:
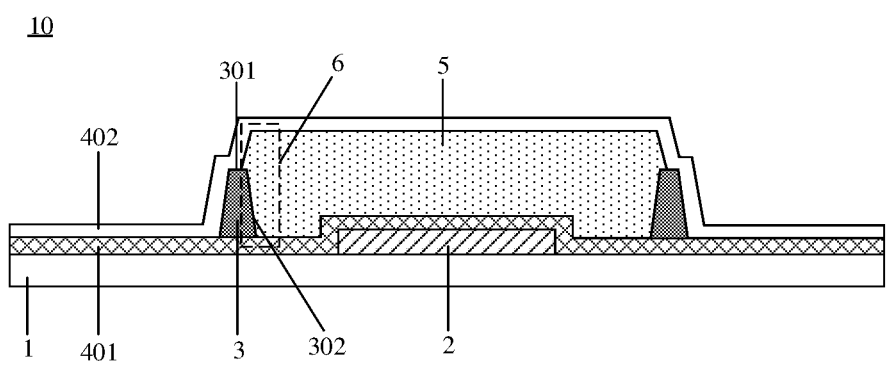
FIG. 2B is a schematic cross-sectional diagram taken along a line A-A' in FIG. 2A.
Figure 3:
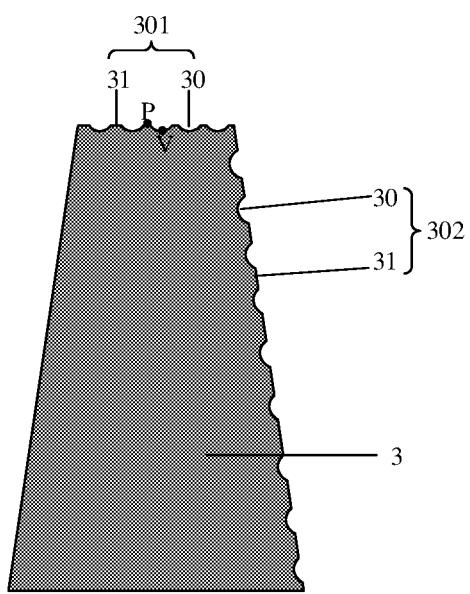
FIG. 3 is a schematic cross-sectional diagram of a barrier dam in the encapsulation structure illustrated in FIG. 2B.

Exemplarily, FIG. 2A is a schematic planar diagram of an encapsulation structure provided by an embodiment of the present disclosure, FIG. 2B is a schematic cross-sectional diagram taken along a line A-A' in FIG. 2A, and FIG. 3 is a schematic cross-sectional diagram of a barrier dam in the encapsulation structure illustrated in FIG. 2B, the left column cross-section of two column cross-sections of the barrier dam 301 illustrated in FIG. 2B is taken as an example. As illustrated in FIG. 2A, FIG. 2B and FIG. 3, an encapsulation structure 10 comprises a base substrate 1, an organic encapsulation layer 5 and a barrier dam 3 that are on the base substrate 1. The barrier dam 3 is disposed outside the organic encapsulation layer 5. In the present disclosure, the term "the barrier dam 3 is disposed outside the organic encapsulation layer 5" refers to the barrier dam 3 is disposed at a side of the organic encapsulation layer 5 that faces an edge of the base substrate 1. For example, as illustrated in FIG. 2A, the barrier dam 3 is disposed around the organic encapsulation layer 5. For example, the barrier dam 3 is surrounds the entire organic encapsulation layer 5. For example, the organic encapsulation layer 5 is made of a liquid organic material, during a manufacturing process of the organic encapsulation layer 5, the barrier dam 3 has a barrier effect on the liquid organic material. The barrier dam 3 comprises an upper surface 301 away from the base substrate 1 and a side surface 302 facing the organic encapsulation layer 5. For example, the upper surface 301 and the side surface 302 of the barrier dam 3 intersect with each other, and at least one selected from a group consisting of the upper surface 301 and the side surface 302 comprises a groove 30 and a protrusion 31. During the manufacturing process of the organic encapsulation layer 5, the liquid organic material spreads toward the edge of the base substrate 1, and the liquid organic material may contact the side surface 302 of the barrier dam 3 or contact both of the side surface 302 and the upper surface 301 of the barrier dam 3. The groove 30 and the protrusion 31 allow each of the upper surface 301 and the side surface 302 to have a larger roughness. In this case, the barrier dam 3 effectively prevents the liquid organic material from excessively spreading to the edge of the base substrate 1, and prevents the liquid organic material from exceeding the preset region for disposing the organic encapsulation layer 5 to enter an edge region of the base substrate 1. In this way, a reserved width of the edge region of the base substrate 1 is reduced, which is beneficial to achieving a narrow frame design. In addition, the barrier dam 3 is disposed around the organic encapsulation layer 5 or along an edge of the organic encapsulation layer 5, which is beneficial to improving the linearity of the edge of the organic encapsulation layer 5. It should be noted that shapes of outlines of the groove 30 and the protrusion 31 are not necessarily the shapes illustrated in the figures, and the shapes of the outlines may be irregular.

It should be noted that the barrier dam 3 is different from a frame sealant (dam sealant) in an encapsulation process. For example, in the case where the frame sealant is required, the frame sealant is disposed at an outer side of the barrier dam 3 (a side close to the edge of the base substrate 1 of the barrier dam 3).

For example, the groove 30 and the protrusion 31 are structures specially provided on the upper surface 301 and the side surface 302 of the barrier dam 3 according to requirements, and are different from an uneven state that cannot be avoided because of process accuracy. The groove 30 refers to a depression structure relative to a surface where the groove 30 is located, and the protrusion 31 refers to a protrusion structure relative to a surface where the protrusion 31 is located. For example, the barrier dam 3 is formed first, and then the groove 30 and the protrusion 31 are formed on at least one selected from the group consisting of the upper surface 301 and the side surface 302 of the barrier dam 3 according to requirements by a process such as an etching process.

For example, the feature "the at least one selected from the group consisting of the upper surface 301 and the side surface 302 comprises the groove 30 and the protrusion 31" comprises the following three cases: (1) only the upper surface 301 comprises the groove 30 and the protrusion 31; (2) only the side surface 302 comprises the groove 30 and the protrusion 31; (3) each of the upper surface 301 and the side surface 302 comprises the groove 30 and the protrusion 31.

For example, the organic material used to form the organic encapsulation layer 5 is a resin material, such as an epoxy resin or an acrylic resin. Of course, the organic material used to form the organic encapsulation layer 5 is not limited to the above types.

For example, at least one selected from the group consisting of the upper surface 301 and the side surface 302 comprises the groove 30 and the protrusion 31, and the groove 30 and the protrusion 31 are configured that at least one selected from the group consisting of the upper surface and the side surface has a surface roughness Rz which is larger than 5 nm, so as to achieve a better effect of preventing the liquid organic material from spreading to the edge of the edge region of the base substrate 1. Rz is a maximum height of the outline of the groove 30 and the protrusion 31, that is, a distance between a peak of the outline and a valley pf the outline within a sampling length (that is, a distance between a highest point and a lowest point). For example, in FIG. 3, taking the upper surface 301 as an example, in the sampling length, for example, the difference between an average value of heights of the highest points P of five protrusions 31 in a direction perpendicular to the base substrate 1 and an average value of heights of the lowest points V of the five grooves 30 in the direction perpendicular to the base substrate 1 is larger than 5 nm. Further, for example, 5 nm<Rz<1000 nm, and the roughness within this range is easy to be formed.

For example, the encapsulation structure 10 further comprises a first inorganic layer 401. For example, in the embodiment illustrated in FIG. 2B, the first inorganic layer 401 and the organic encapsulation layer 5 are stacked with each other. The organic encapsulation layer 5 and the barrier dam 3 are both located on a side of the first inorganic layer 401 away from the base substrate 1. For example, the first inorganic layer 401 is disposed on the base substrate 1 and covers the electronic device 2 and at least a part of the base substrate 1, so as to achieve sealing the electronic device 2. For example, the electronic device 2 is also covered by the organic encapsulation layer 5, that is, an orthographic projection of the electronic device 2 on a surface of the base substrate 1 facing the organic encapsulation layer 5 is within an orthographic projection of the organic encapsulation layer 5 on the surface of the base substrate 1 facing the organic encapsulation layer 5.

For example, the electronic device 2 is an organic light emitting diode (OLED) device, an inorganic light emitting diode, or other electronic components that need encapsulation. The base substrate 1 is, for example, a glass substrate, a quartz substrate, or the like. For example, the base substrate 1 is a flexible substrate. In this case, for example, a material of the base substrate 1 is polyimide. Of course, the type and material of the base substrate 1 are not limited to the above-listed types, and the embodiments of the present disclosure are not limited in this aspect.

For example, in the embodiment illustrated in FIG. 2B, an edge 6 of the organic encapsulation layer 5 is in contact with the side surface 302 of the barrier dam Sand the upper surface 301 of the barrier dam 3, and no other structure is between the surface of the organic encapsulation layer 5 that is in contact with the barrier dam 3 and the barrier dam 3. In this case, for example, both of the side surface 302 and the upper surface 301 of the barrier dam 3 have the groove 30 and the protrusion 31, so that both of the side surface 302 and the upper surface 301 of the barrier dam 3 effectively prevent the liquid organic material from excessively spreading to the edge of the base substrate 1.

It should be noted that, in conjunction with FIG. 2B, the edge 6 of the organic encapsulation layer 5 refers to a portion of the organic encapsulation layer 5 close to the barrier dam 3.

Figure 4A:
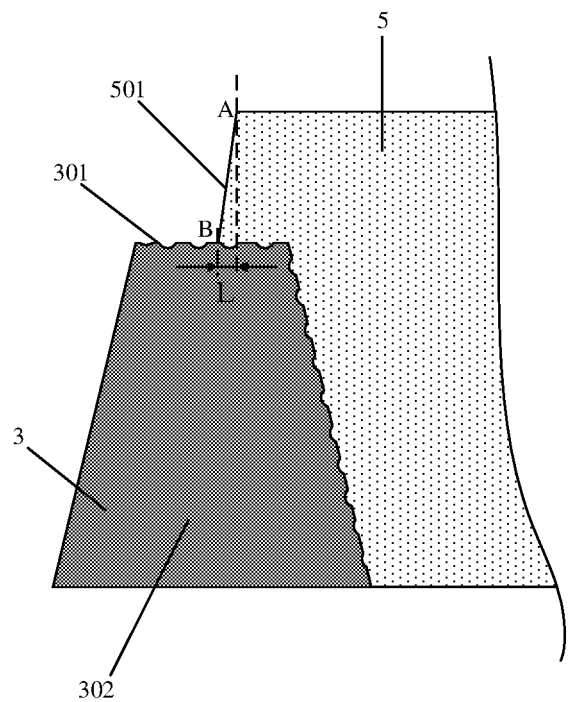
FIG. 4A is a schematic enlarged diagram of an edge of an organic encapsulation layer illustrated in FIG. 2B.
Figure 4B:
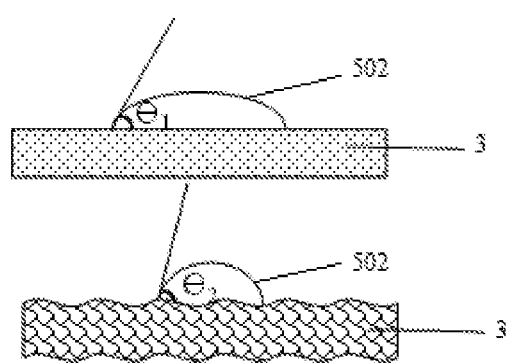
FIG. 4B is a schematic diagram of contact angles between a liquid organic material and barrier dams with different surface roughnesses.

For example, FIG. 4A is a schematic enlarged diagram of the edge 6 of the organic encapsulation layer illustrated in FIG. 2B, and the left column in two column cross sections of the barrier dam 301 illustrated in FIG. 2B is taken as an example. FIG. 4B is a schematic diagram of contact angles between a liquid organic material and barrier dams having different surface roughnesses. As illustrated in FIG. 4A, the edge of the organic encapsulation layer 5 comprises an inclined surface 501, and the inclined surface 501 has an included angle with a surface of the base substrate 1 facing the organic encapsulation layer 5. The inclined surface 501 comprises a first end A and a second end B. From the first end A to the second end B, a thickness of the organic encapsulation layer 5 in a direction perpendicular to the base substrate 1 gradually decreases. The smaller a width L of an orthographic projection of the inclined surface 501 on the base substrate 1 in a direction from an orthographic projection of the first end A on the base substrate 1 to an orthographic projection of the second end B on the base substrate 1 is, the less easily the organic encapsulation layer 5 spreads beyond the preset region. During the spread of the liquid organic material used to form the organic encapsulation layer 5, and the material for forming the barrier dam 3 is unchanged, the larger the roughnesses of the side surface 302 of the barrier dam 3 and the upper surface 301 of the barrier dam 3 that are in contact with the liquid organic material are, the larger the contact angle between the liquid organic material and the barrier dam 3 is. As illustrated in FIG. 4B, in the case where the liquid organic material 502 is in contact with a surface of the barrier dam 3 with a small surface roughness, the contact angle is θ1; in the case where the liquid organic material 502 is in contact with a surface of the barrier dam 3 with a large surface roughness, the contact angle is θ2. θ1<θ2, and the liquid organic material 502 forming a large contact angle θ2 has a low wetting degree on the surface of the barrier dam 3, and has a small contact area in contact with the surface of the barrier dam 3. Therefore, in FIG. 4A, the groove 30 and the protrusion 31 increase the roughnesses of the side surface 302 and the upper surface 301 of the barrier dam 3, thereby facilitating the increase of the contact angle between the liquid organic material used to form the organic encapsulation layer 5 and the upper surface 301 of the barrier dam 3, and reducing the width L, which is beneficial to realizing a product with a narrow frame, such as a display device with a narrow frame. For example, in the embodiments of the present disclosure, the width L is less than 2 mm, which better meets the requirements of the narrow frame product.

Figure 2C:
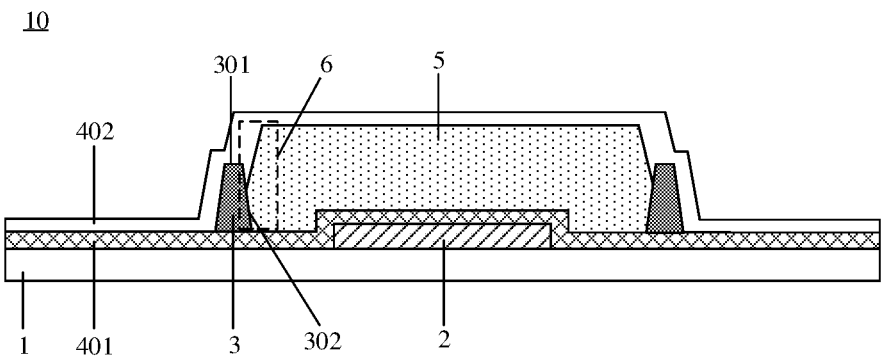
FIG. 2C is another schematic cross-sectional diagram taken along the line A-A' in FIG. 2A.

FIG. 2C is another schematic cross-sectional diagram taken along line A-A' in FIG. 2A. In another embodiment of the present disclosure, as illustrated in FIG. 2C, for example, the edge 6 of the organic encapsulation layer 5 is in contact with the side surface 302 of the barrier dam 3. For example, the side surface 302 of the barrier dam 3 comprises the groove 30 and the protrusion 31. When the liquid organic material used to form the organic encapsulation layer 5 spreads to the side surface 302 of the barrier dam 3, the side surface 302 effectively prevents the liquid organic material from further spreading to the edge of the base substrate 1. In this case, for example, the organic encapsulation layer 5 does not contact the upper surface 301 of the barrier dam 3. For example, in FIG. 2C, only the side surface 302 of the barrier dam 3 comprises the groove 30 and the protrusion 31.

Figure 2D:
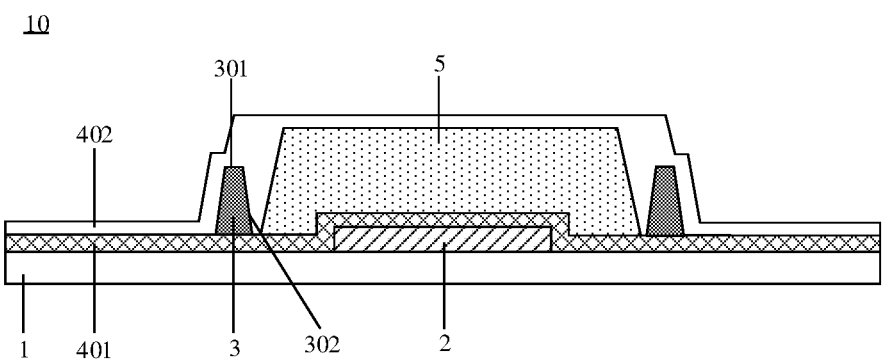
FIG. 2D is another schematic cross-sectional diagram of an encapsulation structure provided by an embodiment of the present disclosure.

FIG. 2D is another schematic cross-sectional diagram of an encapsulation structure provided by an embodiment of the present disclosure. For another example, in another embodiment of the present disclosure, as illustrated in FIG. 2D, the spreading degree of the liquid organic material to the edge of the base substrate 1 is small, a gap is between the organic encapsulation layer 5 and the barrier dam 3, and the organic encapsulation layer 5 is not in contact with the barrier dam 3.

For example, as illustrated in FIG. 2B, the encapsulation structure 10 further comprises a second inorganic layer 402 stacked with the organic encapsulation layer 5. The second inorganic layer 402 covers the organic encapsulation layer 5 and the barrier dam 3, and the second inorganic layer 402 is in contact with the upper surface 301 of the barrier dam 3. The groove 30 and the protrusion 31 on the upper surface 301 of the barrier dam 3 allow the upper surface 301 of the barrier dam 3 to have a larger roughness, and increase the contact area of the second inorganic layer 402 and the barrier dam 3, which is beneficial to enhancing the bonding strength of the second inorganic layer 402 and the barrier dam 3, so that a better sealing effect is obtained.

For example, in the embodiment illustrated in FIG. 2C and FIG. 2D, the second inorganic layer 402 is in contact with both of the upper surface 301 and the side surface 302 of the barrier dam 3. In this case, each of the upper surface 301 and the side surface 302 of the barrier dam 3 comprises the groove 30 and the protrusion 31, and has a larger roughness, so that the contact area of the second inorganic layer 402 and the barrier dam 3 is further increased, which is more beneficial to enhancing the bonding strength between the second inorganic layer 402 and the barrier dam 3, so as to obtain a better sealing effect.

In the embodiment illustrated in FIG. 2D, the second inorganic layer 402 covers the organic encapsulation layer 5, the barrier dam 3 and the gap between the organic encapsulation layer 5 and the barrier dam 3, and the second inorganic layer 402 is in contact with both of the upper surface 301 of the barrier dam 3 and the surface 302 of the barrier dam 3, and the second inorganic layer 402 is in contact with the first inorganic layer 401 at the gap. Therefore, in addition to enhancing the bonding strength between the second inorganic layer 402 and the barrier dam 3, the bonding strength between the second inorganic layer 402 and the first inorganic layer 401 is also enhanced, and the sealing effect at the gap is improved.

For example, as illustrated in FIGS. 2B-2D, a height of the barrier dam 3 in a direction perpendicular to the base substrate 1 is smaller than a thickness of the organic encapsulation layer 5 in the direction perpendicular to the base substrate 1. The lower height of the barrier dam 3 is beneficial to the stability of the barrier dam 3 and does not increase the thickness of the encapsulation structure 10, which is also beneficial to reducing the thickness of the encapsulation structure 10, so that a light and thin product are obtained. For example, the encapsulation structure 10 is suitable for a light and thin display device.

It should be noted that other features not mentioned in the encapsulation structure illustrated in FIG. 2C and FIG. 2D are the same as those of the encapsulation structure illustrated in FIG. 2B. Please refer to the previous descriptions, and details are not described again.

Figure 5A:
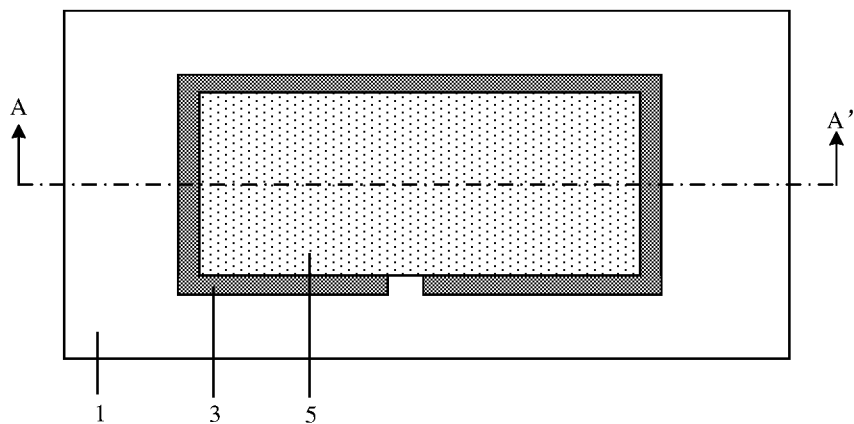
FIG. 5A is a schematic planar diagram of another encapsulation structure provided by an embodiment of the present disclosure.
Figure 5B:
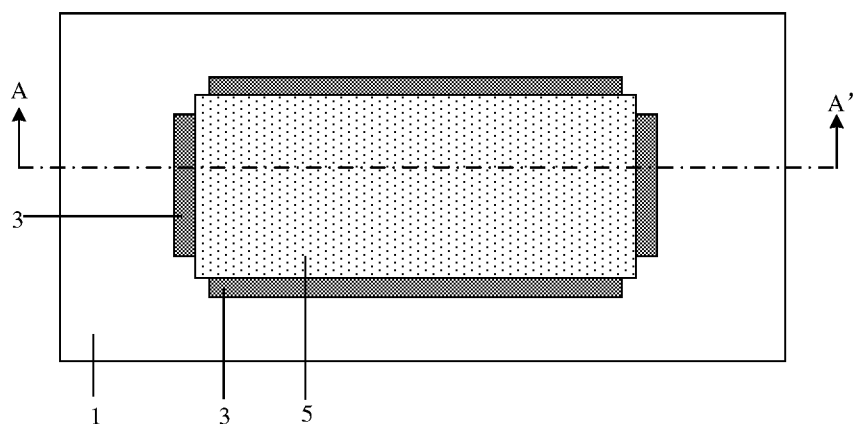
FIG. 5B is a schematic planar diagram of further another encapsulation structure provided by an embodiment of the present disclosure.
Figure 5C:
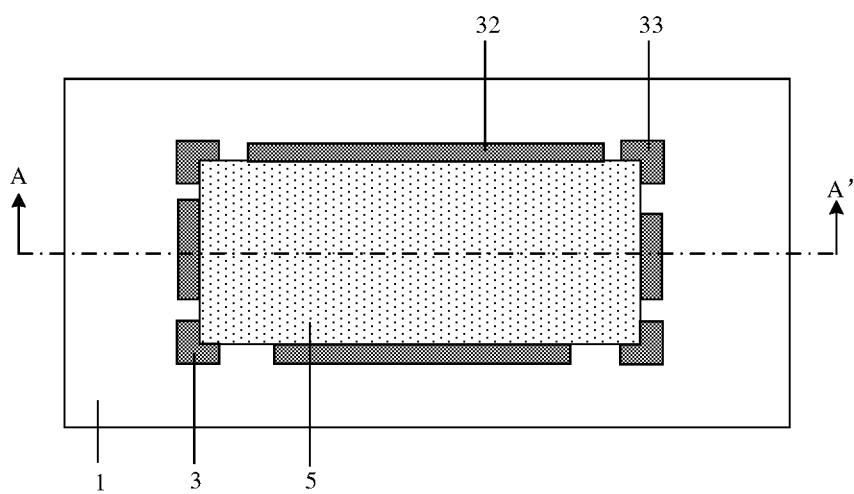
FIG. 5C is a schematic planar diagram of still another encapsulation structure provided by an embodiment of the present disclosure.

FIG. 5A is a schematic planar diagram of another encapsulation structure provided by an embodiment of the present disclosure; FIG. 5B is a schematic planar diagram of further another encapsulation structure provided by an embodiment of the present disclosure; and FIG. 5C is a schematic planar diagram of still another encapsulation structure provided by an embodiment of the present disclosure. For example, viewed from the direction perpendicular to the base substrate 1, a planar shape of the barrier dam 3 is a closed ring shape, as illustrated in FIG. 2A. Or, for example, the planar shape of the barrier dam 3 is an unclosed ring shape, as illustrated in FIG. 5A. For another example, viewed from the direction perpendicular to the base substrate 1, the planar shape of the barrier dam 3 comprises a plurality of strips extending along the edge of the organic encapsulation layer 5, as illustrated in FIG. 5B. For example, in the example illustrated in FIG. 5B, the planar shape of the organic encapsulation layer 5 comprises a plurality of sides, and each of the plurality of sides corresponds to a stripe-shaped barrier dam 3 extending along the respective side. For another example, as illustrated in FIG. 5C, the organic encapsulation layer 5 comprises a corner, that is, the planar shape of the organic encapsulation layer 5 comprises a corner, and the planar shape of the barrier dam 3 comprises a plurality of strip-shaped portions 32 extending along the edge of the organic encapsulation layer 5 and a bent portion 33 surrounding the corner of the organic encapsulation layer 5. For example, the planar shape of the organic encapsulation layer 5 comprises a plurality of corners, and the planar pattern of the barrier dam 3 comprises a plurality of bent portions 33 respectively surrounding each of the plurality of corners.

For example, a material of the barrier dam 3 is a hydrophobic material. In the case where the surface roughnesses of the upper surface 301 of the barrier dam 3 and the side surface 302 of the barrier dam 3 are unchanged, the more hydrophobic the material of the barrier dam 3 is, the larger the contact angle between the upper surface 301 and the organic encapsulation layer 5 is, and the larger the contact angle between the side surface 302 and the organic encapsulation layer 5 is. The contact angle being increased is beneficial to reducing the width L of the inclined surface 501, thereby achieving a narrow frame. For example, the material of the barrier dam 3 is a hydrophobic organic material, such as polyurethane, polydimethylsiloxane, or the like. Of course, in an embodiment of the present disclosure, the material of the barrier dam 3 may be other organic materials, such as polyimide (PI). Alternatively, the material of the barrier dam 3 is an inorganic material, such as silicon oxide, silicon nitride, or silicon oxynitride. It should be noted that the material of the barrier dam 3 is not limited to the types listed above.

Figure 6A:
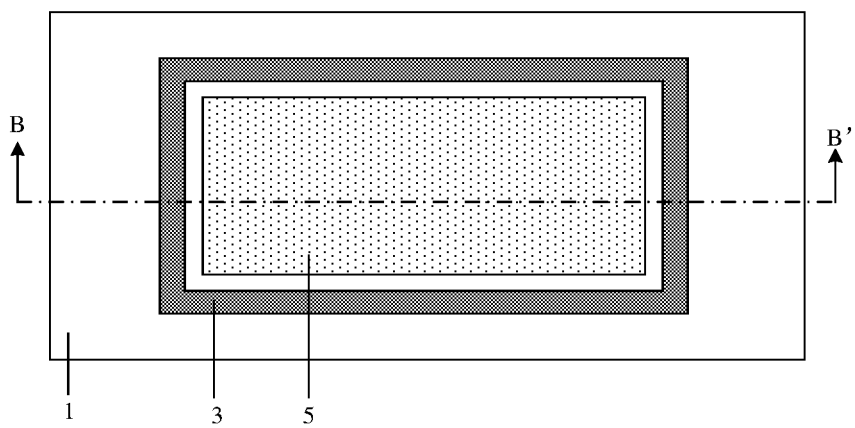
FIG. 6A is a schematic planar diagram of still another encapsulation structure provided by an embodiment of the present disclosure.
Figure 6B:
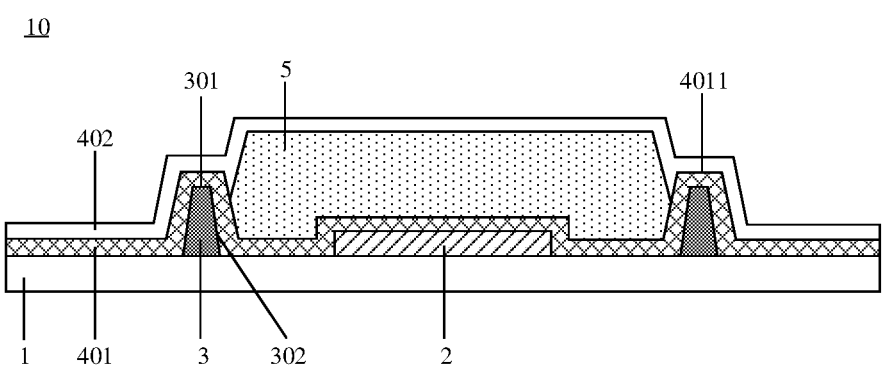
FIG. 6B is a schematic cross-sectional diagram taken along a line B-B' in FIG. 6A.

FIG. 6A is a schematic planar diagram of another encapsulation structure provided by an embodiment of the present disclosure, and FIG. 6B is a schematic cross-sectional diagram taken along a line B-B' in FIG. 6A. In the encapsulation structure 10 illustrated in FIG. 6A and FIG. 6B, the organic encapsulation layer 5 is disposed on a side of the first inorganic layer 401 away from the substrate 1, the first inorganic layer 401 covers the barrier dam 3, and the first inorganic layer 401 is in contact with the upper surface 301 of the barrier dam 3 and the side surface 302 of the barrier dam 3. In this case, grooves 30 and protrusions 31 on the upper surface 301 and the side surface 302 of the barrier dam 3 allow the upper surface 301 and the side surface 302 to have larger roughnesses, which increases the contact area of the first inorganic layer 401 and the barrier dam 3, which is beneficial to enhancing the bonding strength between the first inorganic layer 401 and the barrier dam 3, so as to obtain a better sealing effect.

Figure 6C:
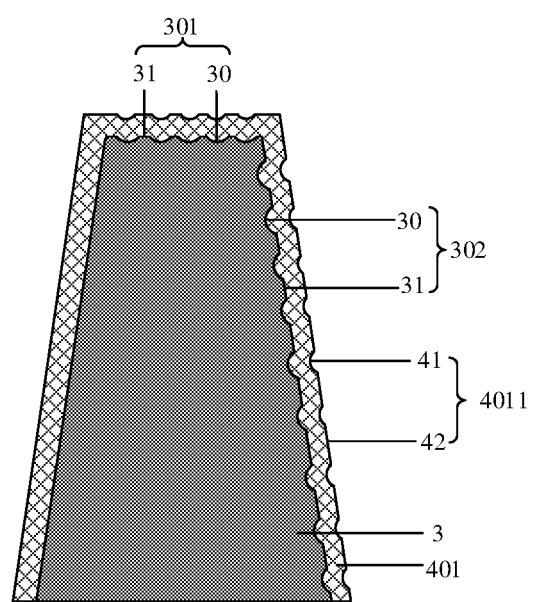
FIG. 6C is a schematic enlarged diagram of a part of a barrier dam and an inorganic encapsulation layer in the encapsulation structure illustrated in FIG. 6B.

For example, FIG. 6C is a schematic enlarged diagram of a part of the barrier dam and the first inorganic layer in the encapsulation structure illustrated in FIG. 6B. The left column in two column sections of the barrier 301 illustrated in FIG. 6B is taken as an example. As illustrated in FIG. 6C, a portion, covering the barrier dam 3, of a surface 4011 of the first inorganic layer 401 away from the base substrate 1 comprises a groove 41 and a protrusion 42. For example, the first inorganic layer 401 is formed on the upper surface 301 and the side surface 302 of the barrier dam 3 by a deposition method, because of the existence of the grooves 30 and protrusions the 31 on the upper surface 301 of the barrier dam 3 and the side surface 302 of the barrier dam 3, The portion of the surface 4011 covering the barrier dam 3 has a similar outline to the upper surface 301 of the barrier dam 3 and the side surface 302 of the barrier dam 3, that is, because the existence of the grooves 30 and the protrusions 31 on the upper surface 301 of the barrier dam 3 and the side surface 302 of the barrier dam 3, the grooves 41 and the protrusions 42 are formed correspondingly on the surface 4011 of the first inorganic layer 401, and shapes of the grooves 41 and the protrusions 42 are respectively similar to those of the grooves 30 and the protrusions 31. For example, the grooves 41 and the protrusions 42 are configured that the portion, covering the barrier dam 3, of the surface 4011 of the first inorganic layer 401 has a relatively large surface roughness, for example, the surface roughness is represented by Rz which is larger than 5 nm.

In FIG. 6B, the organic encapsulation layer 5 is in contact with the surface 4011 of the first inorganic layer 401 away from the base substrate 1. The grooves 41 and the protrusions 42 on the surface 4011 of the first inorganic layer 401 are configured that the portion of the surface 4011 covering the barrier dam 3 has a larger surface roughness, so that the portion of the surface 4011 covering the barrier dam 3 effectively prevents the liquid organic material for forming the organic encapsulation layer 5 from excessively spreading to the edge of the base substrate 1, thereby preventing the liquid organic material from exceeding the preset region of the organic encapsulation layer 5 to enter the edge region of the base substrate 1. Similarly, the width L of the edge of the organic encapsulation layer 5 is also reduced. In this case, the width of the reserved edge region of the base substrate 1 is reduced, which is beneficial to achieving the narrow frame design.

For example, the encapsulation structure 10 illustrated in FIG. 6B further comprises a second inorganic layer 402 stacked with the organic encapsulation layer 5, the second inorganic layer 402 covers the organic encapsulation layer 5 and the first inorganic layer 401, and the second inorganic layer 402 is in contact with the surface 4011 of the first inorganic layer 401 away from the base substrate 1. The grooves 41 and the protrusions 42 on the surface 4011 are configured that the portion of the surface 4011 covering the barrier dam 3 to have a larger surface roughness, so as to increase the contact area of the second inorganic layer 402 and the first inorganic layer 401, which is beneficial to enhancing the bonding strength between the second inorganic layer 402 and the first inorganic layer 401, so as to obtain a better sealing effect.

It should be noted that other features not mentioned in the encapsulation structure illustrated in FIG. 6B are the same as those of the encapsulation structure illustrated in FIG. 2B. Please refer to the previous descriptions, and details are not described again.

Figure 7A:
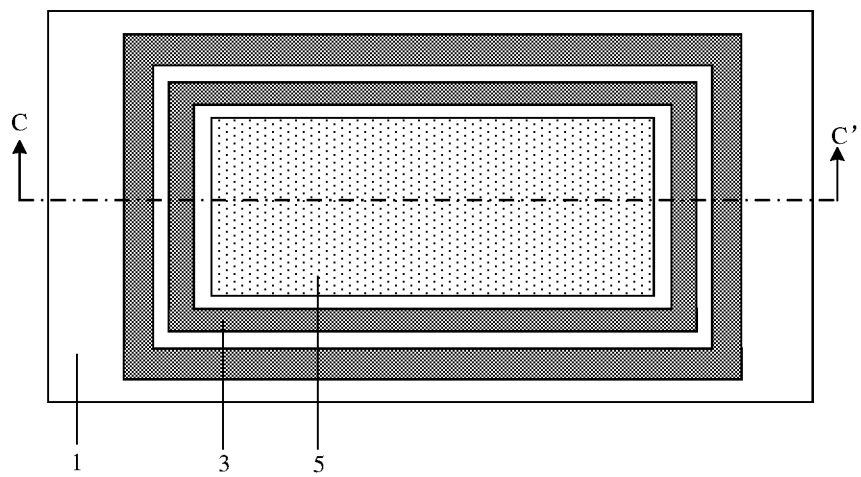
FIG. 7A is a schematic planar diagram of further still another encapsulation structure provided by an embodiment of the present disclosure.
Figure 7B:
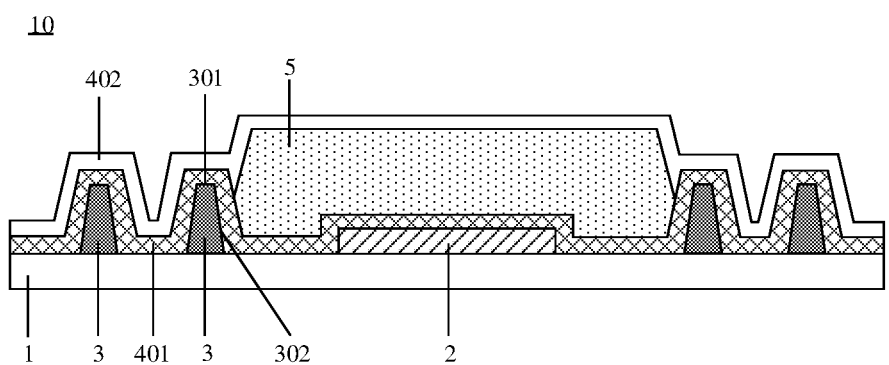
FIG. 7B is a schematic cross-sectional diagram taken along a line C-C' in FIG. 7A.

FIG. 7A is further another schematic planar diagram of an encapsulation structure provided by an embodiment of the present disclosure, and FIG. 7B is a schematic cross-sectional diagram along a line C-C' in FIG. 7A. The difference between the encapsulation structure 10 illustrated in FIG. 7A and FIG. 7B and the encapsulation structure illustrated in FIG. 6B is that the display panel comprises barrier dam the barrier dams 3, and in a direction away from the organic encapsulation layer 5, the plurality of barrier dams 3 are spaced apart from each other. In this way, on the one hand, the plurality of barrier dams 3 further prevents the organic encapsulation layer 5 from spreading out, and ensures that the liquid organic material used to form the organic encapsulation layer 5 does not extend beyond the preset region; on the other hand, the plurality of barrier dams 3 spaced apart from each other further improve the sealing effect of the first inorganic layer 401 and the second inorganic layer 402 on the electronic device 2. Other features of the encapsulation structure illustrated in FIG. 7A and FIG. 7B are the same as those in FIG. 6B, please refer to the previous descriptions. For example, the structure of the plurality of barrier dams 3 illustrated in FIG. 7B can also be used in FIG. 2B.

Figure 7C:
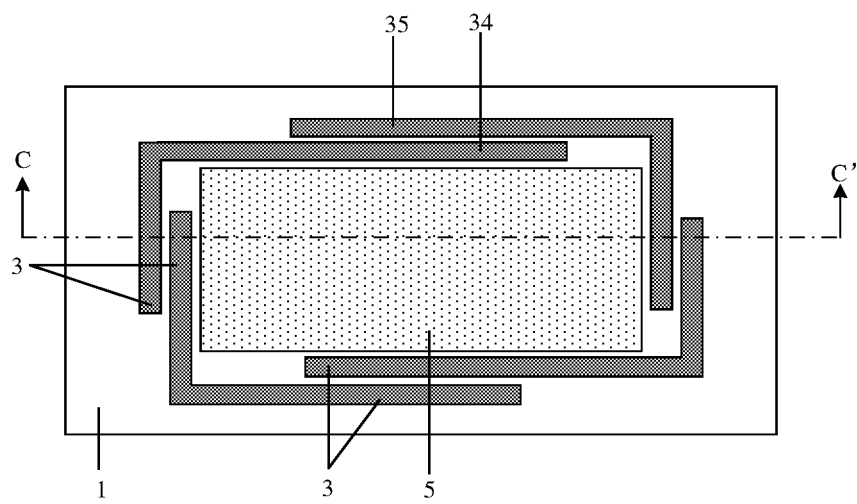
FIG. 7C is a schematic planar diagram of still another encapsulation structure provided by an embodiment of the present disclosure.

FIG. 7C is a schematic planar diagram of another encapsulation structure provided by an embodiment of the present disclosure. For example, the planar shape of each of the plurality of barrier dams 3 is a closed ring shape, as illustrated in FIG. 7A. For another example, as illustrated in FIG. 7C, the planar pattern of each barrier dam 3 comprises bent portions extending along edges of the organic encapsulation layer 5, and each of the bent portions surrounds one of the corners of the organic encapsulation layer. The bent portions are partially overlapped with each other in a direction perpendicular to the edge of the base substrate 1, so that each of the bent portions comprises an inner strip portion 34 and an outer strip portion 35. For example, the inner stripe portion 34 and the outer stripe portion 35 are partially overlapped with each other in the direction perpendicular to the edge of the base substrate 1, so that the bent portions collectively surround the entire organic encapsulation layer 5, so as to block the organic encapsulation layer 5 at various positions outside the organic encapsulation layer 5. For example, in the direction perpendicular to the edge of the base substrate 1, a plurality of stripe-shaped barrier dams 3 are spaced apart from each other. For example, the inner stripe portion 34 is spaced apart from the outer stripe portion 35. The term "inner" refers to a side away from the edge of the base substrate 1, and the term "outer" refers to a side close to the edge of the base substrate 1.

At least one embodiment of the present disclosure further provides an electronic apparatus, the electronic apparatus comprises any one of the encapsulation structures provided by the embodiments of the present disclosure. The electronic apparatus further comprises an electronic component 2, the electronic component 2 is disposed on the base substrate 1 and covered by the organic encapsulation layer 5, as illustrated in FIG. 2B.

Figure 8:
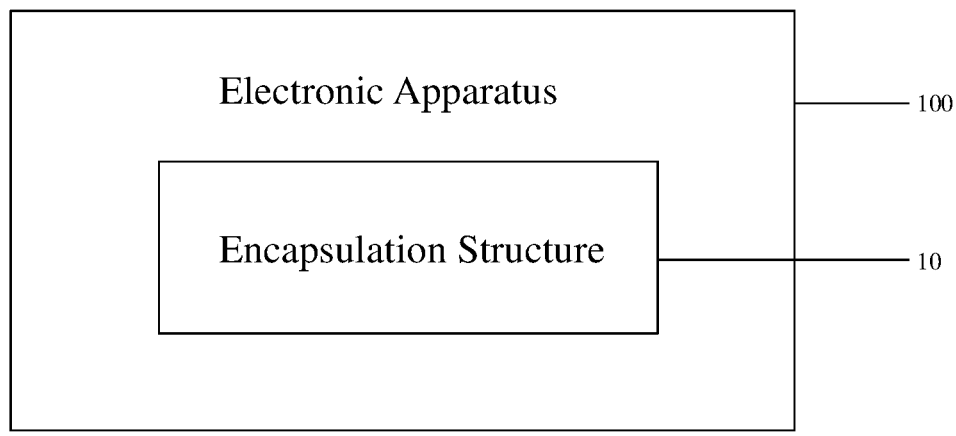
FIG. 8 is a schematic diagram of an electronic apparatus provided by an embodiment of the present disclosure.

Exemplarily, FIG. 8 is a schematic diagram of an electronic apparatus provided by an embodiment of the present disclosure. As illustrated in FIG. 8, the electronic apparatus 100 comprises any encapsulation structure 10 provided by the embodiments of the present disclosure. The electronic apparatus 100 has a narrower frame. The electronic component of the electronic apparatus 100 has a better sealing performance and can achieve a longer service life.

For example, the electronic apparatus may comprise any device having a sealing requirement on the electronic device such as a light emitting device. The electronic apparatus 100 may be a display apparatus (such as an OLED display apparatus). For example, the electronic apparatus 100 is a product or component having a display function, such as a mobile phone, a tablet computer, a television, a display, a notebook computer, a digital camera, a navigator, and the like. For example, the electronic apparatus 100 is a lighting device (such as an OLED lighting apparatus), such as a decorative lantern, a flexible lighting device, or the like. For example, the electronic apparatus 100 is a backlight. The embodiments of the present disclosure do not limit the type of the electronic apparatus.

It should be noted that FIG. 8 is only a schematic diagram of an electronic apparatus comprising any one of the encapsulation structures provided by the embodiments of the present disclosure, and for other structures not illustrated of the electronic apparatus, those skilled in the art may refer to conventional technologies, and the embodiments are not limited in this aspect.

At least one embodiment of the present disclosure further provides an encapsulation method, and the encapsulation method comprises: providing a base substrate; forming an electronic device on the base substrate; forming an organic encapsulation layer, in which the organic encapsulation layer covers the electronic device; forming a barrier dam, in which the barrier dam comprises an upper surface away from the base substrate and a side surface facing the organic encapsulation layer, and at least one selected from a group consisting of the upper surface and the side surface comprises a groove and a protrusion, in which the organic encapsulation layer is formed after forming the barrier dam, and the barrier dam is formed outside the organic encapsulation layer.

FIG. 9A-9H are schematic diagrams of an encapsulation method provided by an embodiment of the present disclosure. The method further comprises: forming a first inorganic layer stacked with the organic encapsulation layer, in which the organic encapsulation layer and the barrier dam are both on a side of the first inorganic layer away from the base substrate; and forming a second inorganic layer stacked with the organic encapsulation layer, in which the second inorganic layer covers the organic encapsulation layer and the barrier dam, and the second inorganic layer is in contact with the upper surface or the side surface of the barrier dam. The specific process of the encapsulation method is as follows.

Figure 9A:
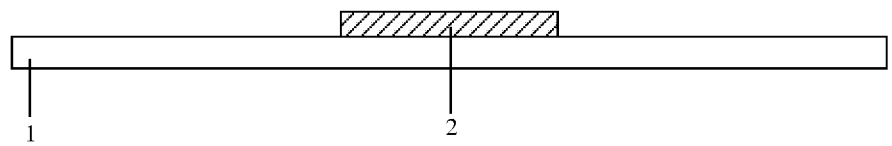
FIGS. 9A-9H are schematic diagrams of an encapsulation method provided by an embodiment of the present disclosure.

As illustrated in FIG. 9A, a base substrate 1 is provided, and an electronic device 2 is formed on the base substrate 1. For example, the electronic device 2 is an OLED device. For example, the OLED device is formed by a semiconductor process. The base substrate 1 is, for example, a glass substrate, a quartz substrate, or the like. For example, the base substrate 1 is a flexible substrate. In this case, for example, a material of the base substrate 1 is polyimide. Of course, the electronic device 2 is not limited to the OLED device, and may be any device that needs to be packaged; the type and material of the base substrate 1 are not limited to the types listed above, and the embodiments of the present disclosure are not limited in this aspect.

Figure 9B:
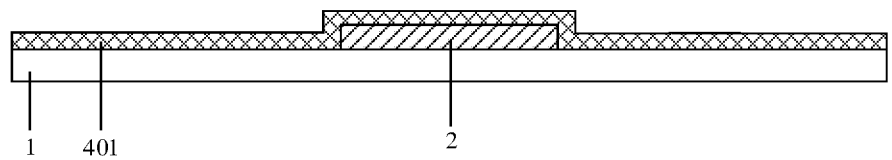

As illustrated in FIG. 9B, a first inorganic layer 401 is formed. For example, the first inorganic layer 401 is formed by a plasma enhanced chemical vapor deposition method or an atomic deposition method. A material of the first inorganic layer 401 is an inorganic material, for example, the inorganic material comprises at least one selected from a group consisting of silicon oxide, silicon nitride and silicon oxynitride.

Figure 9C:
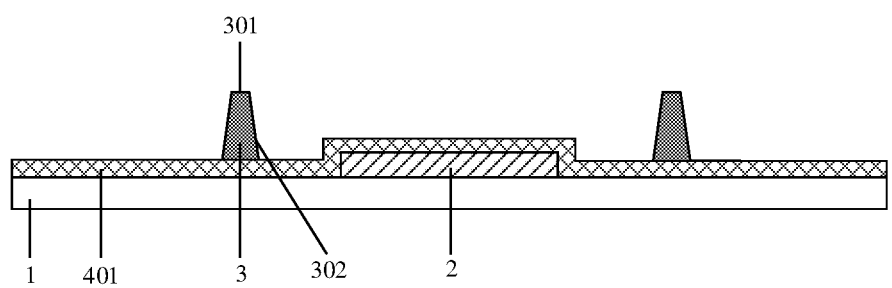

As illustrated in FIG. 9C, a barrier dam 3 is formed. The barrier dam 3 is outside the electronic device 2. The space inside the barrier dam 3 (the side away from the edge of the substrate 1) is used for subsequently forming the organic encapsulation layer. The barrier dam 3 comprises an upper surface 301 away from the base substrate 1 and a side surface 302 facing the organic encapsulation layer to be formed subsequently. For example, the barrier dam 3 is formed by an inkjet printing process or a coating process in combination with a patterning process (such as a photolithography process). For the planar pattern of the barrier dam 3, please refer to the description of the above embodiments, and details are not described herein again.

Figure 9D:
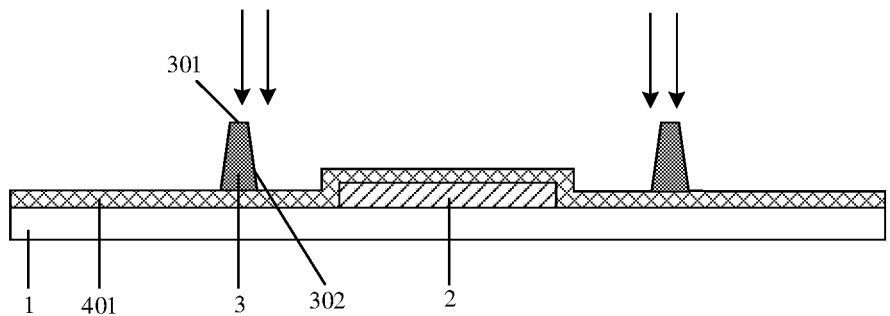

As illustrated in FIG. 9D, the upper surface 301 or/and the side surface 302 of the barrier dam 3 are processed so that at least one selected from a group consisting of the upper surface 301 and the side surface 302 comprises a groove and a protrusion. For example, each of the upper surface 301 and the side surface 302 comprises the groove and the protrusion. For specific features of the groove and the protrusion, please refer to the descriptions in the above embodiments. For example, the process comprises plasma etching, laser etching, or the like.

Figure 9E:
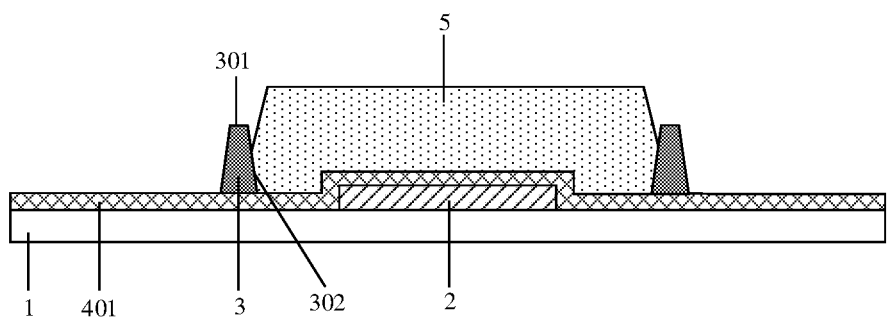
Figure 9F:
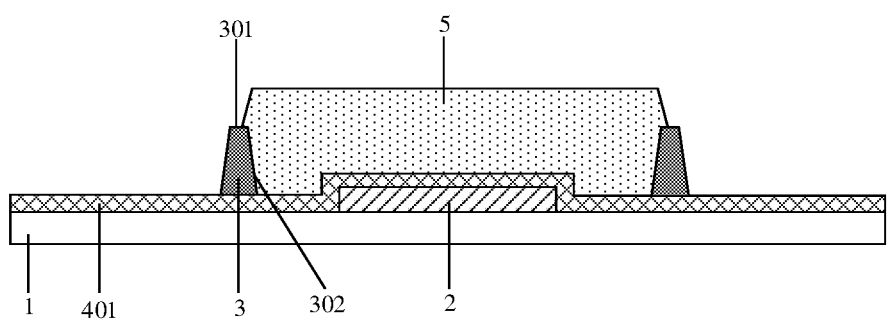

As illustrated in FIG. 9E, an organic encapsulation layer 5 is formed on a side of the first inorganic layer 401 away from the base substrate 1 and inside the barrier dam 3, so that the barrier dam 3 is outside the organic encapsulation layer 5 and the organic encapsulation layer 5 covers the electronic device 2. The step of forming the organic encapsulation layer 5 comprises forming an organic material layer using a liquid organic material by a coating method and curing the organic material layer to obtain the organic encapsulation layer 5. Before curing the organic material layer, the liquid organic material may spread toward the edge of the base substrate 1, when the liquid organic material contacts the side surface 302 of the barrier dam 3 (as illustrated in FIG. 9E), or when the liquid organic material contacts the side surface 302 and the upper surface 301 of the barrier dam 3 (as illustrated in FIG. 9F), because the grooves and the protrusions on the side surface 302 and the upper surface 301 are configured that the upper surface 301 and the side surface 302 have relatively large roughnesses, in this case, the barrier dam 3 effectively prevents the liquid organic material from excessively spreading to the edge of the base substrate 1, and prevents the liquid organic material from spreading beyond the preset region of the organic encapsulation layer 5 to enter the edge region of the base substrate 1. In this way, the width of the reserved edge region of the base substrate 1 is reduced, which is beneficial to achieving a narrow frame design.

For example, the groove and the protrusion are formed by the above process so that the surface roughness Rz of at least one selected from the group consisting of the upper surface 301 and the side surface 302 is lager than 5 nm, so as to achieve a better effect of preventing the spread of the liquid organic material. Further, for example, 5 nm<Rz<1000 nm, the upper surface 301 or the side surface 302 having the roughness of the above range is easy to be prepared, and is more easily to be obtained by the etching process.

Figure 9G:
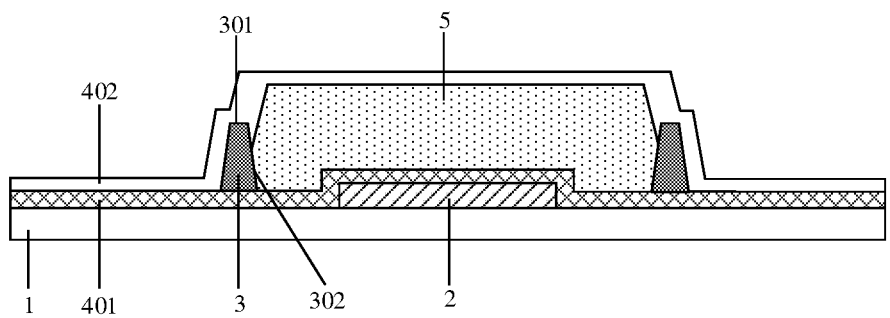

In one embodiment, a second inorganic layer 402 stacked with the organic encapsulation layer 5 is formed on the basis of the structure illustrated in FIG. 9E. The second inorganic layer 402 covers the organic encapsulation layer 5 and the barrier dam 3, and the second inorganic layer 402 is in contact with the upper surface 301 of the barrier dam 3, thereby obtaining the encapsulation structure as illustrated in FIG. 9G. For example, the second inorganic layer 402 is formed by a deposition method (such as the chemical vapor deposition method or the atomic deposition method). The groove 30 and the protrusion 31 are provided on at least one selected from the group consisting of the upper surface 301 and the side surface 302 of the barrier dam 3, so that the at least one elected from the group consisting of the upper surface 301 and the side surface 302 of the barrier dam 3 has a larger roughness, which increases the contact area of the second inorganic layer 402 and the barrier dam 3, and enhances the bonding strength between the second inorganic layer 402 and the barrier dam 3, so as to obtain a better sealing effect.

Figure 9H:
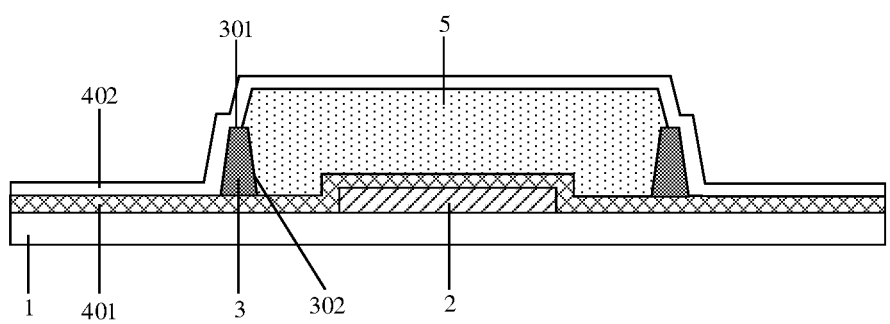

In another embodiment, a second inorganic layer 402 is formed on the basis of the structure illustrated in FIG. 9F, and the second inorganic layer 402 is in contact with both of the upper surface 301 of the barrier dam 3 and the side surface 302 of the barrier dam 3, so as to obtain the encapsulation structure as illustrated in FIG. 9H. For example, each of the upper surface 301 of the barrier dam 3 and the side surface 302 of the barrier dam 3 comprises the groove 30 and the protrusion 31, and both of the upper surface 301 of the barrier dam 3 and the side surface 302 of the barrier dam 3 have a larger roughness, so that the contact area of the second inorganic layer 402 and the barrier dam 3 is further increased, which is more beneficial to enhancing the bonding strength between the second inorganic layer 402 and the barrier dam 3, so as to obtain a better sealing effect.

FIG. 10A-10G are schematic diagrams of another encapsulation method provided by an embodiment of the present disclosure, the method further comprises: forming a first inorganic layer stacked with the organic encapsulation layer, in which the organic encapsulation layer is on a side of the first inorganic layer far away from the base substrate, the first inorganic layer covers the barrier dam, and the first inorganic layer contacts the upper surface and the side surface of the barrier dam; a portion, covering the barrier dam, of a surface of the first inorganic layer away from the base substrate comprises a groove and a protrusion; and forming a second inorganic layer stacked with the organic encapsulation layer, in which the second inorganic layer covers the organic encapsulation layer and the first inorganic layer, and the second inorganic layer is in contact with a surface of the first inorganic layer away from the base substrate. The specific process of the encapsulation method is as follows.

Figure 10A:
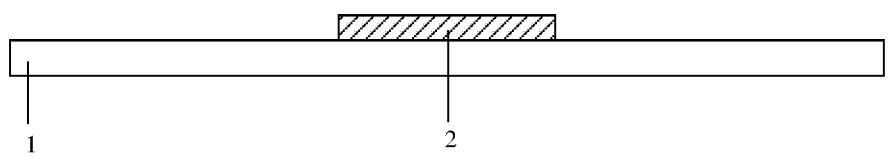
FIGS. 10A-10G are schematic diagrams of another encapsulation method provided by an embodiment of the present disclosure.

As illustrated in FIG. 10A, a base substrate 1 is provided, and an electronic device 2 is formed on the base substrate 1. Please refer to the description of FIG. 9A for details.

Figure 10B:
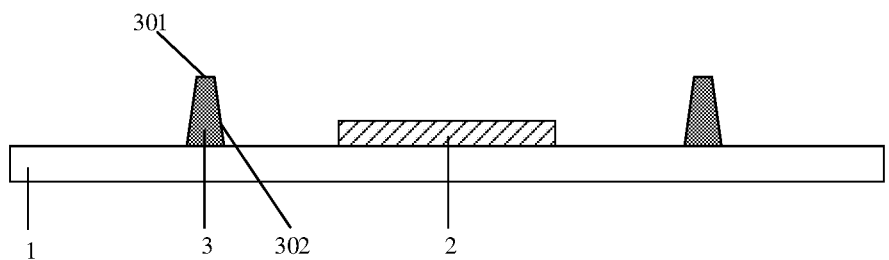

As illustrated in FIG. 10B, a barrier dam 3 is formed on the base substrate 1, for example, no other layer is between the barrier dam 3 and the base substrate 1. The barrier dam 3 is outside the electronic device 2, and a space inside the barrier dam 3 (the side away from the edge of the base substrate 1) is used to form the organic encapsulation layer subsequently. The barrier dam 3 comprises an upper surface 301 away from the base substrate 1 and a side surface 302 facing the organic encapsulation layer to be formed subsequently. For example, the barrier dam 3 is formed by an inkjet printing process or a coating process in combination with a patterning process (such as a photolithography process). Please refer to the description of the above embodiments for the planar pattern of the barrier dam 3, and details are not described herein again.

Figure 10C:
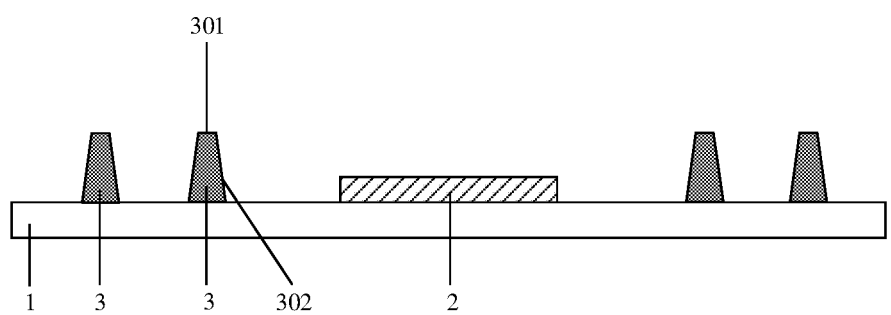

For example, a plurality of barrier dams 3 are formed, and the plurality of barrier dams 3 are spaced apart from each other in a direction away from the organic encapsulation layer 5, as illustrated in FIG. 10C.

Figure 10D:
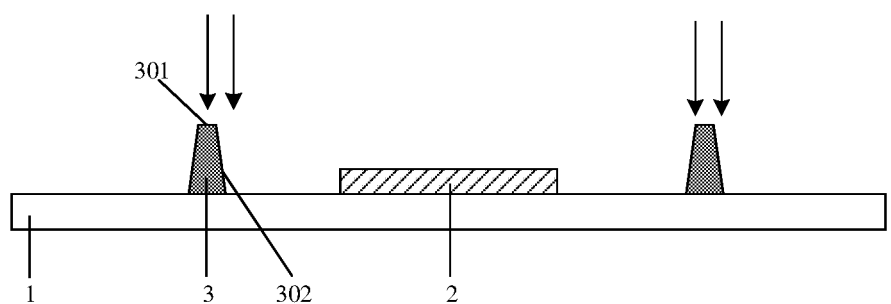

Taking the structure illustrated in FIG. 10B as an example, after the barrier dam 3 is formed, the process illustrated in FIG. 10D is performed. The upper surface 301 or/and the side surface 302 of the barrier dam 3 are processed so that at least one selected from the group consisting of the upper surface 301 and the side surface 302 comprises a groove and a protrusion. This method is the same as the method in the above embodiments, please refer to the previous descriptions.

Figure 10E:
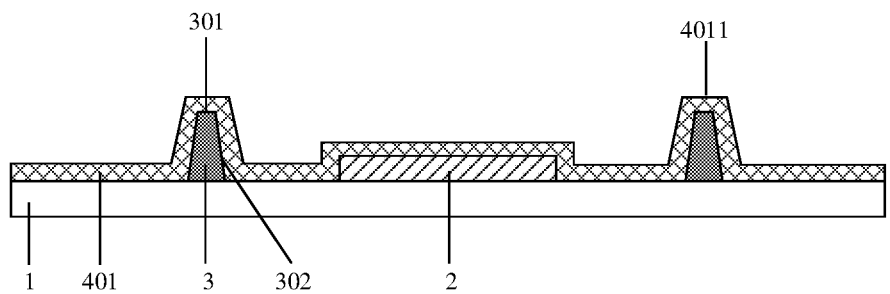

As illustrated in FIG. 10E, a first inorganic layer 401 is formed, the first inorganic layer 401 covers the barrier dam 3, and the first inorganic layer 401 is in contact with both of the upper surface 301 of the barrier dam 3 and the side surface 302 of the barrier dam 3; The portion, covering the barrier dam 3, of the surface 4011 of the base substrate 1 comprises a groove and a protrusion. For specific features of the groove and the protrusion, please refer to the descriptions in the above embodiments. For example, the first inorganic layer 401 is formed by a deposition method (such as the chemical vapor deposition method or the atomic deposition method).

Figure 10F:
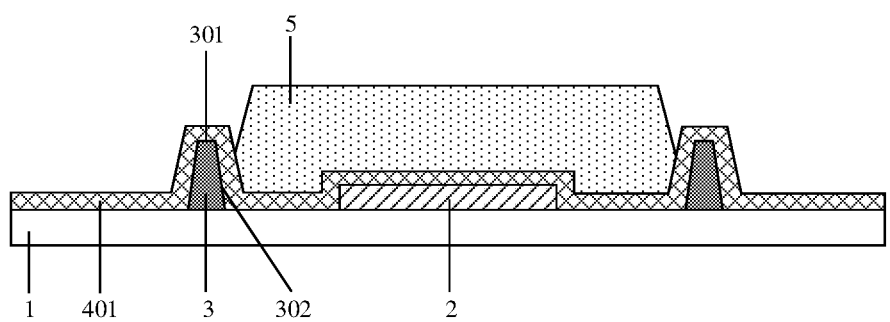

As illustrated in FIG. 10F, an organic encapsulation layer 5 is formed on the side of the first inorganic layer 401 away from the base substrate 1 and inside the barrier dam 3, so that the barrier dam 3 is located outside the organic encapsulation layer 5, and the organic encapsulation layer 5 is stacked with the first inorganic layer 401 and covers the electronic device 2. The specific method of forming the organic encapsulation layer 5 is the same as the method in the above embodiments, please refer to the previous descriptions. The liquid organic material may spread toward the edge of the base substrate 1. When the liquid organic material contacts the portion, covering the barrier dam 3, of the surface 4011 of the first inorganic layer 401 away from of the base substrate 1, because the groove and the protrusion on the portion, covering the barrier dam 3, of the surface 4011 are configured that the portion, covering the barrier dam 3, of the surface 4011 has a relatively large surface roughness, in this case, the portion, covering the barrier dam 3, of the surface 4011 effectively prevents the liquid organic material from excessively spreading to the edge of the base substrate 1, and prevents the liquid organic material from spreading beyond the preset region of the organic encapsulation layer 5 to enter the edge region of the base substrate 1. In this way, the width of the reserved edge region of the base substrate 1 is reduced, which is beneficial to achieving a narrow frame design.

Figure 10G:
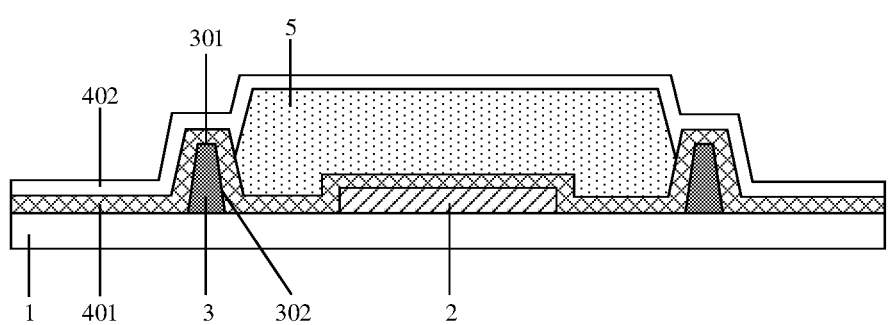

As illustrated in FIG. 10G, a second inorganic layer 402 stacked with the organic encapsulation layer 5 is formed. The second inorganic layer 402 covers the organic encapsulation layer 5 and the first inorganic layer 401, and the second inorganic layer 402 is in contact with a surface of the first inorganic layer 401 away from the base substrate. The groove and the protrusion on the surface 4011 of the first inorganic layer 401 are configured that the portion, covering the barrier dam 3, of the surface 4011 has a larger surface roughness, which increases the contact area of the second inorganic layer 402 and the first inorganic layer 401, and enhances the bonding strength between the second inorganic layer 402 and the first inorganic layer 401, thereby obtaining a better sealing effect.

What have been described above are only specific implementations of the present disclosure, and the protection scope of the present disclosure is not limited thereto. The protection scope of the present disclosure should be based on the protection scope of the claims.

What is claimed is:

1. An encapsulation structure, comprising: a base substrate, an electronic device on the base substrate, an organic encapsulation layer and a barrier dam that are on the base substrate, wherein
the organic encapsulation layer covers the electronic device;
the barrier dam is partially at an outer side of the organic encapsulation layer away from the electronic device;
the barrier dam comprises an upper surface away from the base substrate and a first side surface facing the organic encapsulation layer in a direction from the barrier dam to the organic encapsulation layer and a second side surface away from the organic encapsulation layer in the direction from the barrier dam to the organic encapsulation layer, and both the upper surface of the barrier dam and the first side surface of the barrier dam comprise a plurality of grooves and a plurality of protrusions that are alternately arranged with each other, the plurality of grooves and the plurality of protrusions are configured that both the upper surface of the barrier dam and the first side surface of the barrier dam has a surface roughness Rz which is larger than 5 nm;
both the surface roughness Rz of the upper surface of the barrier dam and the surface roughness Rz of the first side surface of the barrier dam are greater than that of the second side surface of the barrier dam; and
the organic encapsulation layer covers at least part of the first side surface of the barrier dam and is in contact with the plurality of grooves and the plurality of protrusions on the first side surface of the barrier dam;
the encapsulation structure further comprises a first inorganic layer stacked with the organic encapsulation layer in a direction perpendicular to the base substrate, wherein the organic encapsulation layer is on a side of the first inorganic layer away from the base substrate;
the first inorganic layer covers the barrier dam, and the first inorganic layer is in contact with the upper surface of the barrier dam or the first side surface of the barrier dam; and
a portion, covering the barrier dam, of a surface of the first inorganic layer away from the base substrate comprises a groove and a protrusion.

2. The encapsulation structure according to claim 1, further comprising a second inorganic layer stacked with the organic encapsulation layer in the direction perpendicular to the base substrate,
wherein the second inorganic layer covers the organic encapsulation layer and the first inorganic layer, and the second inorganic layer is in contact with the surface of the first inorganic layer away from the base substrate.

3. The encapsulation structure according to claim 1, wherein an edge of the organic encapsulation layer is in contact with the first side surface of the barrier dam.

4. An encapsulation structure, comprising: a base substrate, an electronic device on the base substrate, an organic encapsulation layer and a barrier dam that are on the base substrate, wherein
the organic encapsulation layer covers the electronic device;
the barrier dam is partially at an outer side of the organic encapsulation layer away from the electronic device;
the barrier dam comprises an upper surface away from the base substrate and a first side surface facing the organic encapsulation layer in a direction from the barrier dam to the organic encapsulation layer and a second side surface away from the organic encapsulation layer in the direction from the barrier dam to the organic encapsulation layer, and both the upper surface of the barrier dam and the first side surface of the barrier dam comprise a plurality of grooves and a plurality of protrusions that are alternately arranged with each other, the plurality of grooves and the plurality of protrusions are configured that both the upper surface of the barrier dam and the first side surface of the barrier dam has a surface roughness Rz which is larger than 5 nm;
both the surface roughness Rz of the upper surface of the barrier dam and the surface roughness Rz of the first side surface of the barrier dam are greater than that of the second side surface of the barrier dam; and
the organic encapsulation layer covers at least part of the first side surface of the barrier dam and is in contact with the plurality of grooves and the plurality of protrusions on the first side surface of the barrier dam;
the organic encapsulation layer further covers at least part of the upper surface of the barrier dam and is in contact with the plurality of grooves and the plurality of protrusions on the upper surface of the barrier dam.

5. The encapsulation structure according to claim 4, further comprising a first inorganic layer stacked with the organic encapsulation layer in a direction perpendicular to the base substrate,
wherein both of the organic encapsulation layer and the barrier dam are on a side of the first inorganic layer away from the base substrate.

6. The encapsulation structure according to claim 5, further comprising a second inorganic layer stacked with the organic encapsulation layer in the direction perpendicular to the base substrate,
wherein the second inorganic layer covers the organic encapsulation layer and the barrier dam, and the second inorganic layer is in contact with the upper surface of the barrier dam or in contact with the second side surface of the barrier dam.

7. The encapsulation structure according to claim 4, wherein a height of the barrier dam in a direction perpendicular to the base substrate is smaller than a thickness of the organic encapsulation layer in the direction perpendicular to the base substrate.

8. The encapsulation structure according to claim 4, wherein viewed from a direction perpendicular to a surface of the base substrate, a planar shape of the barrier dam is a closed ring shape or an unclosed ring shape.

9. The encapsulation structure according to claim 4, wherein viewed from a direction perpendicular to a surface of the base substrate, a planar shape of the barrier dam comprises a plurality of strips extending along an edge of the organic encapsulation layer.

10. The encapsulation structure according to claim 4, wherein viewed from a direction perpendicular to a surface of the base substrate, a planar shape of the organic encapsulation layer comprises a corner, and a planar shape of the barrier dam comprises a bent portion surrounding the corner of the organic encapsulation layer.

11. The encapsulation structure according to claim 4, comprising a plurality of barrier dams, wherein in the direction from the barrier dam to the organic encapsulation layer, the plurality of barrier dams are spaced apart from each other;

the barrier dam according to claim 4 is the barrier dam among the plurality of barrier dams closest to the organic encapsulation layer.

12. The encapsulation structure according to claim 4, wherein a material of the barrier dam is a hydrophobic material.

13. The encapsulation structure according to claim 12, wherein the hydrophobic material is polyurethane or polydimethylsiloxane.

14. The encapsulation structure according to claim 4, wherein the electronic device is an organic light-emitting diode device or an inorganic light-emitting diode device.

15. An electronic apparatus, comprising: the encapsulation structure according to claim 4.

16. An encapsulation structure, comprising: a base substrate, an electronic device on the base substrate, an organic encapsulation layer and a barrier dam that are on the base substrate, wherein the organic encapsulation layer covers the electronic device;

the barrier dam is partially at an outer side of the organic encapsulation layer away from the electronic device;

the barrier dam comprises an upper surface away from the base substrate and a first side surface facing the organic encapsulation layer in a direction from the barrier dam to the organic encapsulation layer and a second side surface away from the organic encapsulation layer in the direction from the barrier dam to the organic encapsulation layer, and both the upper surface of the barrier dam and the first side surface of the barrier dam comprise a plurality of grooves and a plurality of protrusions that are alternately arranged with each other, the plurality of grooves and the plurality of protrusions are configured that both the upper surface of the barrier dam and the first side surface of the barrier dam has a surface roughness Rz which is larger than 5 nm;

both the surface roughness Rz of the upper surface of the barrier dam and the surface roughness Rz of the first side surface of the barrier dam are greater than that of the second side surface of the barrier dam; and the organic encapsulation layer covers at least part of the first side surface of the barrier dam and is in contact with the plurality of grooves and the plurality of protrusions on the first side surface of the barrier dam;

an edge of the organic encapsulation layer is in contact with the first side surface of the barrier dam;

the edge of the organic encapsulation layer comprises an inclined surface, and the inclined surface has an included angle with a surface of the base substrate facing the organic encapsulation layer;

the inclined surface comprises a first end and a second end, and from the first end to the second end, a thickness of the organic encapsulation layer in a direction perpendicular to the base substrate is gradually reduced; and a width of an orthographic projection of the inclined surface on the base substrate in a direction from an orthographic projection of the first end on the base substrate to an orthographic projection of the second end on the base substrate is less than 2 mm.

17. The encapsulation structure according to claim 16, further comprising a first inorganic layer stacked with the organic encapsulation layer in a direction perpendicular to the base substrate, wherein both of the organic encapsulation layer and the barrier dam are on a side of the first inorganic layer away from the base substrate.

18. The encapsulation structure according to claim 17, further comprising a second inorganic layer stacked with the organic encapsulation layer in the direction perpendicular to the base substrate, wherein the second inorganic layer covers the organic encapsulation layer and the barrier dam, and the second inorganic layer is in contact with the first side surface of the barrier dam or in contact with the upper surface of the barrier dam or in contact with the second side surface of the barrier dam.

19. The encapsulation structure according to claim 16, comprising a plurality of barrier dams, wherein in the direction from the barrier dam to the organic encapsulation layer, the plurality of barrier dams are spaced apart from each other;

the barrier dam according to claim 16 is the barrier dam among the plurality of barrier dams closest to the organic encapsulation layer.

20. The encapsulation structure according to claim 16, wherein a material of the barrier dam is a hydrophobic material;

the hydrophobic material is polyurethane or polydimethylsiloxane.

* * * * *